United States Patent [19]

Chapron et al.

[11] Patent Number: 5,017,997
[45] Date of Patent: May 21, 1991

[54] INTEGRATED CIRCUIT WITH HIGH OUTPUT CURRENT I²L TRANSISTOR

[75] Inventors: Claude E. P. Chapron, Caen; Jean B. Parpaleix, Paris, both of France

[73] Assignee: U.S. Philips Corp., New York, N.Y.

[21] Appl. No.: 445,897

[22] Filed: Dec. 1, 1989

Related U.S. Application Data

[63] Continuation of Ser. No. 173,683, Mar. 24, 1988, abandoned.

[30] Foreign Application Priority Data

Mar. 24, 1987 [FR] France ................................. 87 04069

[51] Int. Cl.⁵ ........................................... H01L 27/082
[52] U.S. Cl. ...................................... 357/44; 357/36; 357/92
[58] Field of Search .................... 357/44, 46, 36, 92

[56] References Cited

U.S. PATENT DOCUMENTS 3,665,266  5/1972  Drozdowicz et al. ................ 357/36
4,163,244  7/1979  Ragonese et al. ..................... 357/92

FOREIGN PATENT DOCUMENTS 55-124258  9/1980  Japan ..................................... 357/92
57-130462  8/1982  Japan ..................................... 357/92

OTHER PUBLICATIONS

Hart et al. Electronics, Oct. 3, 1974, pp. 111-118.
Berger, IEEE J of Solid State Circuits, vol. SC9, No. 5, Oct. 1974, pp. 218-227.
Korns, IEEE B of Solid State Circuits, vol. SC11, No. 5, Oct. 1976, pp. 712-717.

*Primary Examiner*—William D. Larkins
*Attorney, Agent, or Firm*—Steven R. Biren

[57] ABSTRACT

The invention relates to an integrated circuit having a transistor suitable for integrated injection logic (I²L) with a single collector output region and having at least one base contact disposed between the collector output region ($C_{60}$, $C'_{60}$) and the injector ($IN_6$), the surface of the collector output region being several times larger than that of a logic gate of the I²L multi-collector type. The base ($B_{60}$) has at least two rows of interconnected contacts: a first row ($CB_{60}$, $CB_{61}$, $CB_{62}$) constituting the base contact disposed between the collector and the injector, and at least a second row ($CB_{63}$, $CB_{64}$, $CB_{65}$) situated at the perimeter of the collector ($C_{60}$, $C'_{60}$), which can consist of one or several parts. The injector ($IN_6$) may also have a row of interconnected contacts ($CIN_1$, $CIN_2$, $CIN_3$).

6 Claims, 3 Drawing Sheets

INTEGRATED CIRCUIT WITH HIGH OUTPUT CURRENT I²L TRANSISTOR

This is a continuation of application Ser. No. 173,683, filed Mar. 24, 1988, now abandoned.

BACKGROUND OF THE INVENTION

The invention relates to an integrated circuit comprising a multi-collector I²L gate and a transistor for internal injection logic (I²L) with a single collector output region and at least one base contact arranged between the collector output region and an injector, the surface area of the collector output region being several times larger than that of a collector of a logic multi-collector I²L gate.

Transistors of the above type capable of operating with a comparatively high output current are frequently used, especially for being mounted in cascade arrangement at the output of a logic I²L gate so that it constitutes an interface circuit with other elements.

In such transistors of high current level, the voltage drop in the base is larger than in a logic I²L gate, which results in that the output current is considerably smaller than could be expected from the ratio between the surface area of the single collector output of the transistor and that of a collector of the logic gate.

Prior art U.S. Pat. Nos. 4,512,075 and 4,322,882 disclose I²L transistors, in which the base resistance is reduced due to the presence of a base contact extending throughout the surface of the base. However it has been found that such a provision has the disadvantage of increasing the phenomena of recombination in the base and of resulting in a reduction of the gain, which is particularly unfavourable in the case of transistors operating at a high current and hence having larger dimensions. Also see U.S. Pat. Nos. 4,075,039 and 4,546,539.

SUMMARY OF THE INVENTION

The invention has for its object to provide an integrated circuit which comprises an I²L transistor with high output current in which the voltage drop in the base is reduced, while maintaining a high gain. Such a transistor is especially suitable for arrangement in cascade with the I²L-gate to form a stage. The basic idea of the invention resides in that, surprisingly, only local base contacts are obtained. According to the invention, the integrated circuit is characterized in that the base of the I²L transistor has at least two rows of interconnected contacts, a first row constituting the said base contact arranged between the collector output region and the injector and at least a second row being situated at the perimeter of the collector output region.

According to a first embodiment corresponding to a technology according to which an interconnection can be formed above the collector output region and can be separated therefrom by an insulator, the collector output region consists of one part and has at least one row of inclusions, through which the base adjoins the surface, while the contacts of the second row of contacts are arranged on the said row of inclusions.

According to a second embodiment, the collector output region is divided into at least two interconnected parts and advantageously into two parts and at least a said second row of base contacts is arranged between the said parts.

According to a preferred variation of this embodiment, the collector output region consists of two parts and the surface area of the part closest to the injector is twice that of the other part.

According to a preferred embodiment, the injector has a row of injector contacts.

BRIEF DESCRIPTION OF THE DRAWINGS

The invention will be understood more clearly after reading the following description given by way of non-limitative example in connection with the accompanying drawings, in which.

DESCRIPTION OF THE PREFERRED EMBODIMENTS

Figure 1:
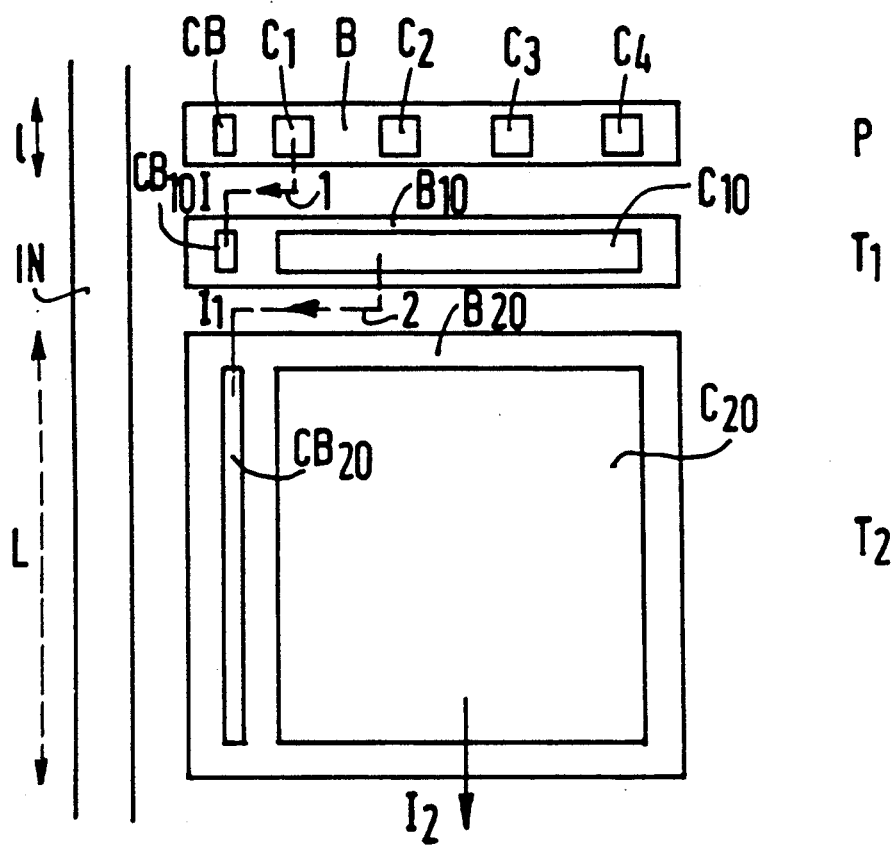
FIG. 1 shows an I²L stage according to the prior art comprising an I²L gate and two I²L transistors connected in cascade arrangement so as to form an interface circuit with the I²L gate.

As shown in FIG. 1, an I²L stage of an integrated circuit according to the prior art comprises two I²L transistors $T_1$ and $T_2$ connected in cascade arrangement at the output of one of the collectors $C_1$ of an I²L gate P which constitutes an interface circuit with one or several other elements. A gate or a transistor of the I²L type comprises an injection transistor, generally a PNP transistor, and a control transistor of the opposite type. The I²L gate P comprises, for example, four collectors $C_1 \ldots C_4$, on which are formed collector contacts (not shown), a base B and an injector I of great length, which is common to the I²L transistors $T_1$ and $T_2$ and a base contact CB between the collector $C_1$ and the injector I. The transistor $T_1$ has a base $B_{10}$ having an outer contour similar to the base of the gate P, a collector $C_{10}$ of elongate rectangular form occupying a large part of the length of the base and a base contact $CB_{10}$ arranged between the collector $C_{10}$ and the injector. The collector $C_1$ and the base $B_{10}$ are interconnected through a connection 1 indicated by a dotted line and extending from the contact of the collector $C_1$ to the base contact $CB_{10}$. The transistor $T_2$ has a base $B_{20}$ having an outer contour of substantially square form, of which one side adjoins the base $B_{10}$ and of which another side adjoins the injector IN. The collector $C_{20}$ of the transistor $T_2$ can have a substantially square form and its contour occupies the major part of that of the base $B_{20}$. A base contact $CB_{20}$ of elongate rectangular form adjoins one side of the collector $C_{20}$ and is arranged between the latter and the injector IN.

Let it be assumed that I is the output current of each of the collectors having a surface area S of the gate P.

The transistor $T_1$, whose collector $C_{10}$ has a surface area $S_1$, supplies an output current $I_1$ having, in the case in which it would be considered as an ideal transistor having a base resistance zero and not exhibiting a recombination in the base part not covered by the collector, a value:

$$I_1 = \frac{S_1}{S} I$$

In the same manner, the transistor $T_2$, whose collector $C_{20}$ has a surface area $S_2$, would have an output current $I_2$ having a value:

$$I_2 = \frac{S_2}{S_1} I_1 = \frac{S_2}{S} I$$

The length L of the injector part IN adjoining the transistor $T_2$ must on the other hand be such that the base current of $T_3$ can be absorbed by the gate P, i.e.:

$$\frac{L}{1} = \frac{I_1}{I} = \frac{S_1}{S}$$

1 designating the injector part adjoining the control transistor of gate P.

In practice, the base resistance in the transistors $T_1$ and $T_2$ is higher than in the gate P and this results in that the output current $I_2$ is considerably smaller than the value given above.

Figure 2:
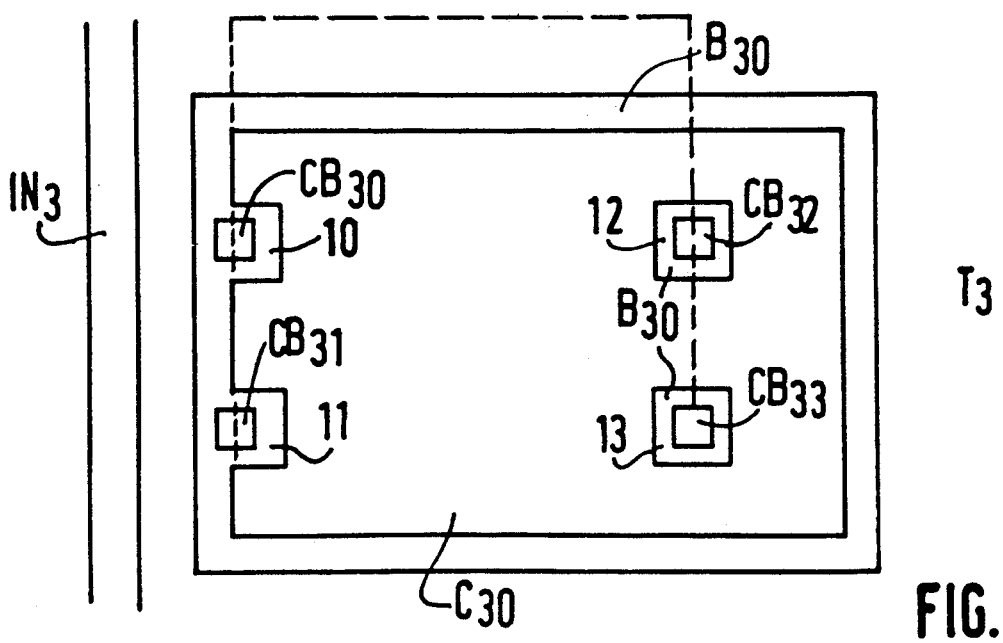
FIG. 2 shows the I²L transistor of the integrated circuit according to the first embodiment of the invention.

According to a first embodiment of the invention shown in FIG. 2, a transistor $T_3$ has two rows of base contacts. The collector output region consists of a collector $C_{30}$. A first row is constituted by the contacts $CB_{30}$ and $CB_{31}$ arranged between the collector $C_{30}$ and the injector $IN_3$ and parallel to the latter and partly included in the collector $C_{30}$ in the open inclusions 10 and 11 of the base $B_{30}$. A second row is constituted by the contacts $CB_{32}$ and $CB_{33}$ disposed in closed inclusions 12 and 13 of the base $B_{30}$.

The dimension of the base contacts $CB_{30} \ldots CB_{33}$ is advantageously the smallest permitted by the technology. In fact, the recombinations are considerably larger under the contact connection region, which results in that, when reducing the dimension of the base contacts, the gain of the transistor $T_3$ is improved.

Figure 3A:
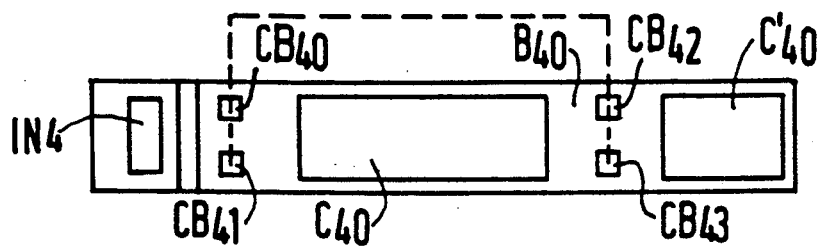
FIGS. 3a, 3b and 4 show I²L transistors of the integrated circuit according to the second embodiment of the invention, in which the collector consists of two interconnected parts.
Figure 3B:
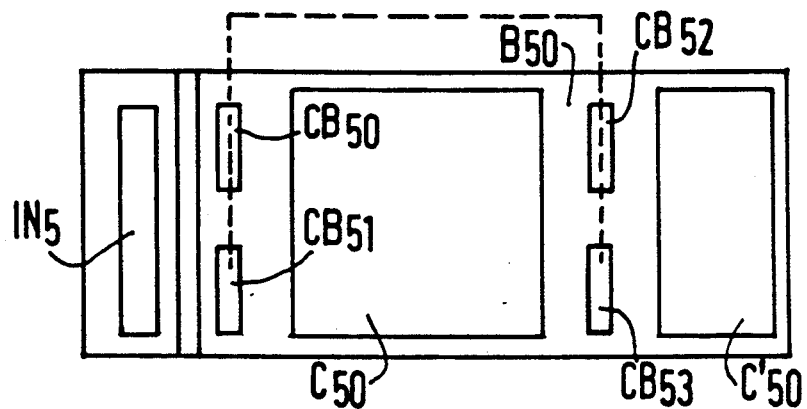
Figure 4:
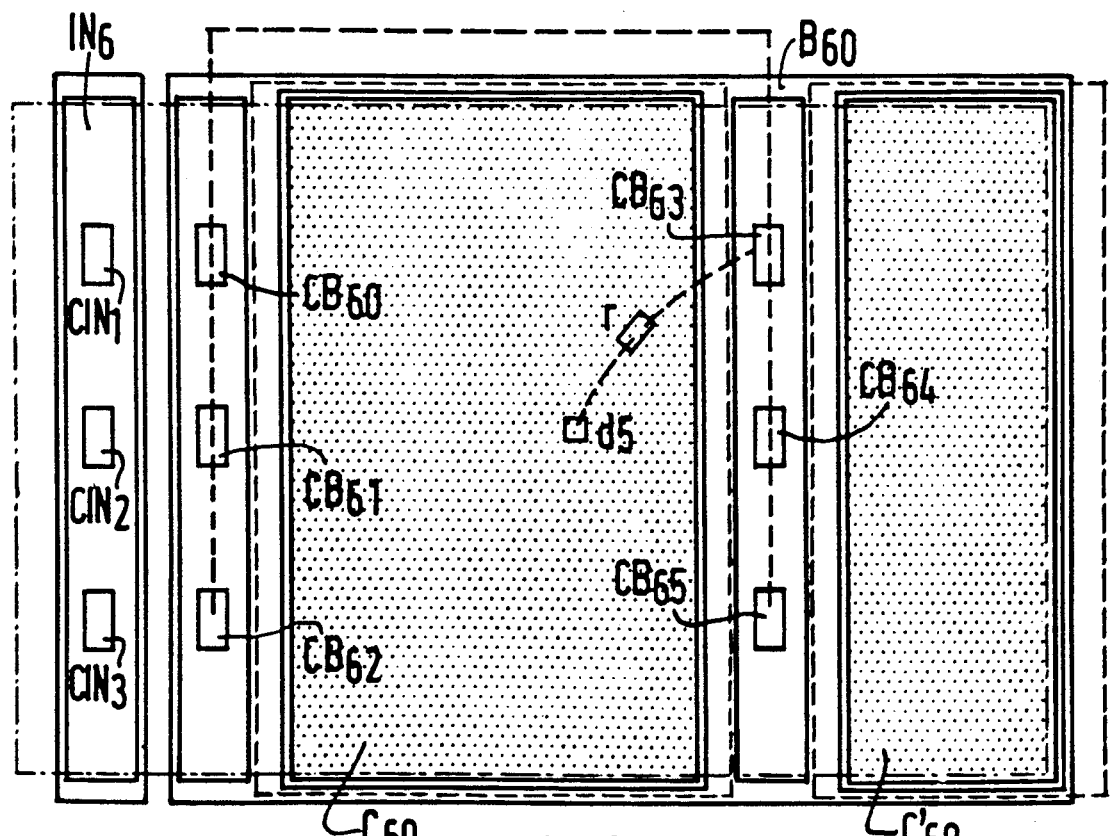

FIGS. 3a, 3b and 4 show the second embodiment of the invention, in which the collector output region of the transistor is divided into two parts, between which a row of base contacts is interposed.

According to FIG. 3a, a transistor $T_4$ corresponding to the configuration of the transistor $T_1$ of FIG. 1, comprises an injector $IN_4$ and a collector output region composed of two interconnected parts, i.e. one on the side of the injector denoted by $C_{40}$ and the other on the opposite side denoted by $C'_{40}$, and both being inscribed in the contour of the base $B_{40}$. The regions $C_{40}$ and $C'_{40}$ have a rectangular elongate contour and preferably the region $C_{40}$ has a surface area twice that of the region $C'_{40}$.

FIG. 3b shows a transistor $T_4$ corresponding to the configuration of the transistor $T_2$ of FIG. 1. Its constitutive elements, i.e. the injector $IN_5$, the collector output region of two interconnected parts $C_{50}$ and $C'_{50}$, the base $B_{50}$, the first row of base contacts $CB_{50}$ and $CB_{51}$ and the second row of base contacts $CB_{52}$ and $CB_{53}$, are disposed in the same manner as the elements denoted by $IN_4$, $C_{40}$, $C'_{40}$, $B_{40}$, $CB_{40}$, $CB_{41}$, $CB_{42}$ and $CB_{43}$, respectively. On the contrary, it is distinguished from the transistor $T_3$ by the form of its elements corresponding to the greatest length of the injector and to the largest surface area of the two parts of the collector output region ($C_{50}$, $C'_{50}$).

According to FIG. 4, the injector $IN_6$ also has a row of interconnected contacts $CIN_1$, $CIN_2$ and $CIN_3$. The base $B_{60}$ has two rows of interconnected contacts, the first row comprising the base contacts $CB_{60}$, $CB_{61}$ and $CB_{62}$ and the second row comprising the base contacts $CB_{63}$, $CB_{64}$ and $CB_{65}$. The collector output region is divided into two interconnected parts $C_{60}$ and $C'_{60}$, the contacts of the second row being disposed between the two parts $C_{60}$ and $C'_{60}$.

When one continuous injector contact is replaced by several interconnected contacts, the gain factor is improved and hence it can be ensured that the same performances for a lower current consumption is obtained.

In connection with FIGS. 4 to 6, it will now be explained how the number and the spacing of the base contacts and injector contacts of one row are determined.

As to the base contacts, two conditions are to be fulfilled.

A first condition relates to the blocking state in which a considerable transitory base current exists and for which the behavior is fairly complex.

Figure 5:
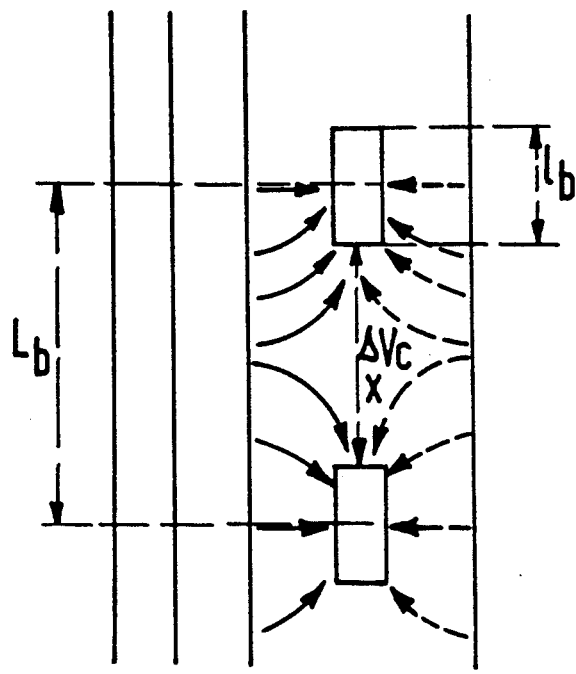
FIG. 5 shows the current lines in the base in the proximity of two base contacts and between the latter.

The current whose current lines are represented in full lines in FIG. 5 is very close to the injection current and is a permanent current. The current represented by dotted lines is a transitory current whose value may be higher than, equal to or lower than that of the preceding current, in accordance with the gain G of the control transistor. For a gain G of 3, it is at most equal to twice that for a structure of two rows of base contacts. Let it be assumed that $L_b$ is the pitch of the base contacts and $l_b$ is the length of the base contacts.

For a permitted voltage difference of $\Delta V_b$, there is approximately:

$$L_b - l_b = (Li - li)\sqrt{\frac{\Delta V_b}{G}} \Delta V_b,$$

expressed in mV.

This condition applies to all the rows of base contacts. $\Delta V_b$ has to be chosen to be smaller than the voltage drop across the base-emitter path of the transistor during the blocking state and to the voltage drop across the collector-emitter path of the controlled transistor. Let it be assumed that for $G=3$, $\Delta V_b=100$ mV and $Li-li=10$ μm (see below), then it follows that $(L_b-l_b)$ is approximately 60 μm. The second condition relates to the conductive state and the problem is static. The voltage drop in the base must not exceed about 10 mV for a conduction current I. This second condition is much more restrictive than the first condition.

The optimization of the structure consists in the highest gain $I^2L$ is obtained, i.e. a maximum output current $I_{OUT}$. There is:

$$I_{OUT} = \int_S^{I_0} e^{\frac{V(ds)}{kT/q}} dS$$

S: overall surface area of the base diminished by the surface area of the contacts;
V(ds): polarization voltage of the surface element dS in the emitter-base junction, and $V(ds) = V_{CT} - Sr\, I(1)\, dl,$ integral being taken along a current line (see FIG. 4);
$V_{CT}$ = base contact voltage.

The diminution of the surface area of the base contacts is favorable in that it leads to an increase of $I_{OUT}$ on the one hand by reduction of the recombination under the metallic contacts and on the other hand because this reduction in surface area can be utilized to increase the surface area of the collector.

Figure 6:
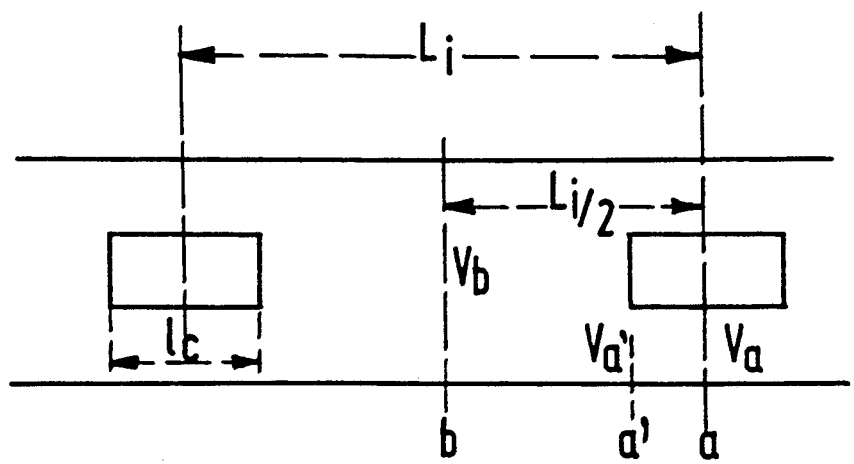
FIG. 6 shows a detail of an injector of a transistor according to the invention.

According to FIG. 6, the length li of an injector contact is chosen so that it is the minimum surface area permitted by the technology. The pitch Li of the injector contacts must be chosen so that the injection current is substantially uniform along the injector.

Let it be assumed that j is the line density of the current along the injector. It is admitted that the current gain of the injection transistor (in this case a PNP transistor) is equal to unity. The calculation is effected for an injection on either side of the injector.

Let it be assumed that $\Delta V_i = V_a = V_b$ is the maximum voltage difference admitted to obtain a density of injection current substantially uniform along the injector(b: point situated in the central plane between two injectors; a: point situated in the central plane of an injector).

For the sake of simplicity, it is also supposed that the current lines are parallel to the injector between the two contacts and perpendicular to that at the level of these contacts.

It results in that Va=Va'.

With a': point situated in the outer plane of an injector contact. Hence:

$$V_{ba} = V_{ba'} = \frac{(Li - li)}{2} j \frac{2(Li - li)}{W2} \rho \frac{1}{2} = \frac{(Li - li)^2}{4W} \rho j \frac{Li - li}{2} j$$

current injected between a' and b $$\frac{2}{W} \frac{(Li - li)}{2} \rho:$$

resistance of the injector between a' and b
j: corresponds to a linear decrease in the resistance of the injector.
W: width of the injector.
j: density of the injection current
ρ: sheet resistance of the injector $$L_i - l_i = 2\sqrt{\frac{\Delta V W}{l_j}}$$

With j=1 μA/μm; $l_i$=4 μm; W=5 μm; ρ=5000Ω per square and ΔV=9 μmV, this leads to (Li−li) being approximately 10 μm.

What is claimed is:

1. An integrated circuit comprising a transistor formed in a first region of a first conductivity type having a surface, said first region forming an emitter of said transistor, an injector of a second conductivity type and a base of the second conductivity type located in said first region of the first conductivity type and spaced apart from each other along said surface, said transistor having an output comprising a single collector region of the first conductivity type located in said base and extending to said surface, said base being provided with a base contact at said surface between said collector region and said injector, wherein said collector region consists of only one part and has at least one row of inclusions through which the base adjoins said surface, and wherein said base is provided with at least two rows of interconnected base contacts, a first row arranged between the collector region and the injector and a second row in which the base contacts are disposed in said inclusions.

2. An integrated circuit as claimed in claim 1 wherein the injector has a row of injection contacts thereto.

3. An integrated circuit comprising a transistor formed in a first region of a first conductivity type having a surface, said first region forming the emitter of said transistor, an injector of a second conductivity type and a base of the second conductivity type located in said first region and spaced apart from each other along said surface, said transistor having an output comprising a collector region of the first conductivity type located in said base and extending to said surface, said base being provided with a base contact at said surface between said collector region and said injector, wherein said collector region is sub-divided into at least two interconnected parts and wherein the base has at least two rows of interconnected base contacts, a first row arranged between the collector region and the injector and a second row in which the base contacts are disposed between two of said collector region parts.

4. An integrated circuit as claimed in claim 3, characterized in that the surface area of the collector region part closest to the injector is about twice that of the other collector region part.

5. An integrated circuit as claimed in claim 3, wherein the injector has a row of injection contacts thereto.

6. An integrated circuit comprising a stage having a first and a second transistor as claimed in claims 1, 2 or 3, the collector region of said second transistor having a larger surface are that that of said first transistor, said stage further comprising a multi-collector logic gate, of which one collector is electrically connected to the base of said first transistor, the total collector region surface area of said first transistor being several times larger that that of said one collector of said gate.

* * * * *